(12) United States Patent
Fujita

(10) Patent No.: US 6,881,680 B2
(45) Date of Patent: Apr. 19, 2005

(54) LOW NITROGEN CONCENTRATION CARBONACEOUS MATERIAL AND MANUFACTURING METHOD THEREOF

(75) Inventor: Ichiro Fujita, Kagawa (JP)

(73) Assignee: Toyo Tanso Co., Ltd., Osaka (JP)

( * ) Notice: Subject to any disclaimer, the term of this patent is extended or adjusted under 35 U.S.C. 154(b) by 0 days.

(21) Appl. No.: 10/170,572

(22) Filed: Jun. 14, 2002

(65) Prior Publication Data

US 2003/0232001 A1 Dec. 18, 2003

(51) Int. Cl.⁷ .................. H01L 21/31; H01L 21/469
(52) U.S. Cl. .................. 438/758; 438/800; 423/460; 423/461
(58) Field of Search .................. 638/758, 783, 638/800; 423/445 R, 460, 461; 427/249.1, 249.6; 118/715; 501/88; 44/505, 591; 438/758, 800, 783

(56) References Cited

U.S. PATENT DOCUMENTS

| 2,734,800 A | 2/1956 | Brooks |
| 5,505,929 A | 4/1996 | Matsumoto et al. |
| 6,452,228 B1 * | 9/2002 | Okuno et al. ............ 257/329 |

FOREIGN PATENT DOCUMENTS

| GB | 880547 | | 10/1961 |
| JP | 11-1376 | | 1/1999 |
| JP | 4110169993 | * | 1/1999 |
| RO | 2071935 | | 1/1997 |
| RU | 394303 | | 12/1973 |

OTHER PUBLICATIONS

Patent Abstracts of Japan, JP 3–177371, Aug. 1, 1991.
Patent Abstracts of Japan, JP 7–148426, Jun. 13, 1995.
Anonymous, Internet Article, Onlinel Retrieved from the Internet: <URL:http://web.archive.org/web/20010815080339/http://www.tevtechllc.com/purification-system.html>, pp. 1–3, XP–002221496, "GRAPHITE PURIFICATION SYSTEM", Nov. 19, 2002.

* cited by examiner

*Primary Examiner*—Alexander Ghyka
(74) *Attorney, Agent, or Firm*—Oblon, Spivak, McClelland, Maier & Neustadt, P.C.

(57) ABSTRACT

The present invention relates to a low nitrogen concentration carbonaceous material with a nitrogen concentration according to glow discharge mass spectrometry of 100 ppm or less, as well as a manufacturing method thereof are provided. A carbonaceous material subjected to a high purification treatment in a halogen gas atmosphere is heat treated under a pressure of 100 Pa or less and at a temperature of 1800° C. or higher, releasing nitrogen in the carbonaceous material and then cooling the material under a pressure of 100 Pa or less or in a rare gas atmosphere.

14 Claims, No Drawings

LOW NITROGEN CONCENTRATION CARBONACEOUS MATERIAL AND MANUFACTURING METHOD THEREOF

DETAILED DESCRIPTION OF THE INVENTION

1. Technical Field of the Invention

This invention relates to a low nitrogen concentration carbonaceous material and, more specifically, it relates to a low nitrogen concentration carbonaceous material used as a jig for manufacturing silicon semiconductors, compound semiconductors, a jig for manufacturing epitaxial layers, a jig for manufacturing silicon carbide (hereinafter referred to as SiC) single crystals, and a jig for epitaxial growing SiC wafers, as well as a manufacturing method thereof.

2. Prior Art

In recent years, the compound semiconductors, such as SiC, gallium arsenide and indium phosphide, have been developed vigorously. Such compound semiconductors have a feature of large energy band gap, high insulation breakdown electric field and the heat conductivity. Then, taking the advantage of the feature, they have attracted attention as materials for use in high efficiency-high breakdown voltage power devices, high frequency power devices, high temperature operation devices or blue to ultraviolet light emitting devices. However, the compounds described above are not melted even at a high temperature under an atmospheric pressure since the bonding energies is strong and it is difficult to obtain bulk crystals by recrystallization from molten Si liquid as used in a case of silicon (hereinafter referred to as Si) semiconductors.

For example, for using SiC as a semiconductor material, it is necessary to obtain high quality single crystals having a certain size. For this purpose, small pieces of SiC single crystals have been obtained so far by a method of utilizing chemical reaction referred to as an Acheson method or a method of utilizing sublimation and recrystallization method referred to as a Rayleigh method. Recently, an SiC ingot is grown by a modified Rayleigh method using SiC single crystals manufactured by the method described above as seed crystals, on which SiC is sublimated and recrystallized, and SiC substrates have been manufactured by slicing and mirror polishing. Then, by growing SiC single crystals of an aimed scale on the substrate by a vapor phase epitaxial growing method or a liquid phase epitaxial growing method to form an active layer controlled with the impurity density and film thickness, and SiC semiconductor devices such as pn junction diodes, shottky diodes and various kinds of transistors are manufactured by using them. The methods described above use carbonaceous materials such as graphite material subjected to high purification treatment in a halogen gas atmosphere and SiC deposited graphite material in which SiC is deposited on the surface of the graphite material.

SUBJECT TO BE SOLVED BY THE INVENTION

However, even a carbonaceous material put to high purification treatment in a halogen gas atmosphere still contains about 1000 ppm of nitrogen. The nitrogen is present not in the pores of the carbonaceous material but present, for example, in a state being trapped between graphite crystal planes, or in a state substituting carbon atoms. Further, nitrogen bonds with metal impurities contained in a slight amount in the carbonaceous material to form nitrogen compounds. Although such nitrogen contained in the carbonaceous material did not particularly attract attention so far, it has recently been found that when the carbonaceous material is used as a jig for manufacturing compound semiconductors, particularly, SiC devices, nitrogen intrudes into SiC during epitaxial growing of SiC single crystals or SiC to increase the nitrogen concentration in SiC single crystals or in SiC wafers to cause defects in crystals. For example, nitrogen is contained by $10^{17}$ atoms/cm$^3$ or more in the SiC wafer and $10^{16}$ atoms/cm$^3$ or more in the epitaxial grown film. Such nitrogen functions as a dopant to the compound semiconductor such as SiC semiconductor to greatly deteriorate the characteristics of the manufactured SiC device.

This invention has a subject of providing a low nitrogen concentration carbonaceous material with a nitrogen concentration measured by glow discharge mass spectrometry (hereinafter referred to as GDMS) of 100 ppm or less, as well as a manufacturing method thereof.

Means for the Solution of the Subject

The present inventors have found that occurrence of defects in crystals such as of compound semiconductors to be manufactured can be suppressed by reducing the nitrogen concentration in the carbonaceous material and using the low nitrogen concentration carbonaceous material as a jig for manufacturing compound semiconductors and have accomplished this invention.

That is, the low nitrogen concentration carbonaceous material according to this invention for solving the subject described above contains a nitrogen concentration according to GDMS of 100 ppm or less. Further, the material is used preferably as a jig for manufacturing silicon semiconductors, compound semiconductor, as well as a jig for manufacturing epitaxial layers.

The nitrogen concentration in the carbonaceous material is 100 ppm or less, preferably, 50 ppm or less, more preferably, 10 ppm or less and, further preferably, 5 ppm or less according to GDMS. This can suppress intrusion of nitrogen into semiconductor products to be produced in a case of using the carbonaceous material as a jig for manufacturing silicon semiconductors or compound semiconductors and a jig for manufacturing epitaxial layers and semiconductors with the nitrogen concentration decreased by one digit or more than usual can be manufactured.

The carbonaceous material used in this invention includes, for example, graphite material, carbon fiber-reinforced carbon composite material, exfoliated graphite sheet, glassy carbon and pyrolytic carbon and those using them as substrates such as SiC deposited graphite material in which SiC is deposited on the surface of a graphite material or pyrolytic carbon deposited graphite material deposited with pyrolytic carbon.

Further, the jig for manufacturing silicon semiconductors and compound semiconductors referred to in this invention include, for example, components in furnaces such as crucibles or heaters used for pulling-up single crystal silicon or compound semiconductors such as SiC single crystals. Further, the jig for manufacturing epitaxial layers can include, for example, susceptors for epitaxial growing of silicon or SiC layers. In addition, the jig also includes those components used for furnaces including heat insulation materials and heaters for heating use.

Further, the method of manufacturing the low nitrogen concentration carbonaceous material according to this invention comprises heat treating a carbonaceous material subjected to a high purification treatment in a halogen gas atmosphere at a pressure of 100 Pa or less and at 1800° C.

or higher, releasing nitrogen in the carbonaceous material, then cooling the same to a predetermined temperature at a pressure of 100 Pa or less and then cooling the material to a room temperature in a rare gas atmosphere. Alternatively, after releasing nitrogen, a rare gas is introduced and cooling is conducted in a rare gas atmosphere.

After applying high purification treatment in a halogen gas atmosphere, the material is successively heat treated under a pressure of 100 Pa or less, preferably, 1 Pa or less at a temperature of 1800° C. or higher, preferably, 2000° C. or higher continuously. Alternatively, the carbonaceous material already put to high purification treatment is again heat treated under the pressure of 100 Pa or less, preferably, 1 Pa or less at a temperature of 1800° C. or higher, preferably, 2000° C. or higher. By the heat treatment, nitrogen or the like trapped between graphite crystal planes upon high purification treatment in a halogen gas atmosphere or graphitization treatment is released from the carbonaceous material. Thus, a carbonaceous material at low nitrogen concentration can be formed. In the cooling, the material is cooled to a predetermined temperature under the pressure of 100 Pa or less, preferably, 1 Pa or less and then a rare gas is introduced and the material is cooled to a room temperature. Alternatively, after the heat treatment for releasing the nitrogen gas, a rare gas is introduced and cooling is conducted to a room temperature in the rare gas atmosphere. This can suppress the introduction of nitrogen into the carbonaceous material during cooling. As the rare gas, an argon gas or a helium gas can be used.

Further, the method of manufacturing the low nitrogen concentration carbonaceous material according to this invention comprises cooling the material to a room temperature in the rare gas atmosphere and then storing the same in a state being kept from atmospheric air.

By storing the material in a state being kept from the atmosphere after the high purification treatment or heat treatment of removing nitrogen or the like in the carbonaceous material, nitrogen concentration in the carbonaceous material can be kept more reliably in a state being kept from the atmospheric air. The state being kept from the atmospheric air is, for example, a state of sealing the carbonaceous material by reducing the inside of a bag excellent in air tightness such as made of a resin film referred to as a vacuum pack to a state where the pressure is reduced to lower than the atmospheric pressure. Alternatively, it designates a state of sealing the carbonaceous material together with a rare gas atmosphere in a bag of excellent air tightness such as made of resin film, which is referred to as a gas pack. The resin film usable herein can include vinyl chloride film, polyethylene film and the like.

Now, graphite material is to be explained as an example of an embodiment of the carbonaceous material used in this invention.

Those graphite materials manufactured by general manufacturing methods can be used in this embodiment. The graphite material is manufactured, in an example of general manufacturing method, by way of a step of at first heating a carbon molded product in a baking furnace to 800 to 1000° C. and baking the same while dispersing and evaporating easily evaporizable ingredients contained in the binder (Step A), a step of taking out the baked product and heating the same for graphitization at 3000° C. in a graphitizing furnace, for example, an Acheson type furnace, Castner type furnace or induction heating furnace (for example in Japanese Patent Kokai Publication Nos. Sho 57-166305, Sho 57-166306, Sho 57-166307, and Sho 57-166308) (Step B), and, further, a step of heating the thus obtained graphite material in a halogen gas atmosphere in the different reactor, converting impurities in the graphite material into materials of high vapor pressure and evaporating them from the base material thereby highly purifying the graphite material (Step C).

In the graphitization and high purification treatment, it has been generally practiced to flow a nitrogen gas at the periphery of a heater or the like requiring for heating thereby preventing the heater from oxidation. Upon graphitization and high purification treatment, the nitrogen gas is trapped between crystal planes of graphite, substituting carbon atoms or reacts with metal impurities slightly remained in the graphite material to form nitrogen compounds.

Generally, cooling after the high purification treatment and the graphitization treatment, cooling has been conducted in a nitrogen atmosphere in order to increase the cooling speed and prevent oxidation of the graphite material. The nitrogen gas introduced into the furnace during cooling is also trapped between the crystal planes of the graphite material or substitutes carbon atoms, or further, reacts with metal impurities remained slightly in the graphite material to form nitrogen compounds.

When the graphite material is used as the jig for manufacturing the silicon semiconductors or compound semiconductors and the jig for manufacturing epitaxial layers, nitrogen remained in the graphite material intrudes into the semiconductors to increase the nitrogen concentration in the semiconductors. It is considered that the nitrogen in the semiconductors causes defects in the crystals.

In this embodiment, nitrogen trapped between the crystal planes of the graphite material, nitrogen atoms substituting for carbon atoms and nitrogen reacting with the metal impurities remained slightly in the graphite material are reduced by keeping the graphite material from being exposed to nitrogen (atmospheric air) as much as possible, or releasing nitrogen by a post treatment in the graphitization treatment and the high purification treatment or after high purification treatment.

That is, in the manufacture of the graphite material according to this embodiment, a rare gas such as an argon gas or a helium gas may also be used instead of the nitrogen gas to be flown to the periphery of a heater upon graphitization or high purification treatment. Further, at the graphitization treatment (Step B), a rare gas such as an argon gas or a helium gas is preferably used as the atmospheric gas. Further, in the high purification treatment (Step C), the material after the halogen gas treatment is heat treated under the pressure of 100 Pa or less, preferably, 1 Pa or less, or in a rare gas atmosphere, for example, of an argon gas or a helium gas at 1800° C. or higher, preferably, 2000° C. or higher, thereby releasing nitrogen present in any form in the graphite material. Further, also during cooling, the cooling treatment is conducted not using the nitrogen gas as much as possible but under the pressure of 100 Pa or less, preferably, 1 Pa or less or in the rare gas atmosphere such as an argon gas or a helium gas. The series of the steps may be conducted continuously in one identical furnace or each of the steps can be conducted in the different furnaces respectively. Further, as the gas flowing to the periphery of the heater at the high purification treatment (Step C), a nitrogen gas is flown during high purification treatment by a halogen gas, and a rare gas such as an argon gas or a helium gas may be introduced upon completion of the high purification treatment by the halogen gas and then heat treatment and cooling treatment are conducted to release the nitrogen gas.

Further, also for the graphite materials after subjected to the graphitization treatment and the high purification treatment by the ordinary method, the nitrogen concentration in the graphite material can be reduced by re-heating the same under the pressure of 100 Pa or less, preferably, 1 Pa or less or in a rare gas atmosphere such as an argon gas or a helium gas at a temperature of 1800° C. or higher, preferably, 2000° C. or higher.

As described above, the nitrogen concentration in the graphite material can be reduced by using the rare gas such as the argon gas or the helium gas instead of the nitrogen gas in the graphitization treatment or the high purification treatment, reducing the nitrogen remained in the graphite material as less as possible if nitrogen is used, or applying a heat treatment additionally to the graphite material manufactured by way of the graphitization treatment and the high purification treatment, under the pressure of 100 Pa or less, preferably, 1 Pa or less or in the rare gas atmosphere such as an argon gas or a helium gas at 1800° C. or higher, preferably, 2000° C. or higher, thereby forming a graphite material with a nitrogen concentration according to GDMS of 100 ppm or less, preferably, 50 ppm or less, more preferably, 10 ppm or less and further preferably, 5 ppm or less.

Measurement for the nitrogen concentration by using GDMS was conducted by using a mass analyzer with glow discharge (VG9000, manufactured by VG Elemental Co.) in a container with an attainment pressure being kept at $10^{-4}$ Pa or less after thoroughly evacuating the nitrogen gas present on the surface and contained in the pores of the graphite material.

Further, when the isotropic high density carbon material disclosed, for example, in Japanese Patent Publication Hei 1-16789 is subjected at first to a high purification treatment with a halogen containing gas at 2400° C. or higher and then a halogen containing gas at 2000° C. or higher is supplied under a reduced pressure, nitrogen concentration in the carbon material can be reduced. As described above, a low nitrogen concentration carbonaceous material with the nitrogen concentration at $1 \times 10^{17}$ atoms/cm$^3$ or less according to an SIMS analysis method (apparatus name: IMS4F, manufactured by Cameca Co.) can be formed by removing nitrogen present between the lattices of carbon atoms or substituting carbon atoms at a high temperature of 2400° C. or higher and removing nitrogen compounds by a high purification treatment conducted simultaneously or subsequently. It is also possible to fabricate the carbonaceous material before the treatment under a reduced pressure at 2000° C. or higher.

Further, the graphite material according to this embodiment may be used as it is as the jig for manufacturing the silicon semiconductors and compound semiconductors and as the jig for manufacturing the epitaxial layers. Further, it can also be used as the substrate for the SiC deposited graphite material. As described above, when it is used as the substrate for SiC deposited graphite material, intrusion of nitrogen into SiC wafers can also be suppressed, for example, in a case of using the material as the jig for manufacturing SiC epitaxial layers.

Further, the graphite material according to this embodiment can be used as the jig for manufacturing silicon semiconductors and compound semiconductors and the jig for manufacturing epitaxial layers, or as the substrate for the SiC deposited graphite materials used therefor, as well as for those portions of nuclear reactors or thermo-nuclear reactors in contact with neutrons. In this case, when nitrogen concentration in the graphite material is low, the area of contact with the neutrons can be kept small. Accordingly, this can suppress the lowering of the utilization efficiency of neutrons. This can enhance the accuracy of nuclear design and can improve the efficiency.

Further, this invention is applicable not only to graphite materials but also generally to carbonaceous materials such as carbon fiber reinforced carbon composite materials, exfoliated graphite sheets, glassy carbon, or SiC deposited graphite material in which SiC is deposited on the surface of the graphite material, pyrolytic carbon deposited graphite material deposited with the pyrolytic carbon, and the same method as for the graphite material is applicable also to other materials than graphite materials.

EXAMPLE

Then, this invention is to be explained specifically referring to examples.

Example 1

This invention is to be explained sequentially.

At first, a carbon material is mounted in a container in the furnace. Then, after introducing a nitrogen gas into the furnace and, after substitution of air inside the container by the nitrogen gas, the pressure in the furnace was lowered. Then, inside of the furnace was heated by gradually increasing the voltage applied to on a heater. After keeping the temperature of the carbon material to be heated by the radiation heat at 800 to 1000° C. for about 5 hours (baking step), the temperature was gradually elevated and kept for 15 hours while being controlled to 2450 to 2500° C. (graphitization step). Since the inside of the furnace was kept at about 0.1 Pa from the start of heating, it was advantageous for exhaustion of a released gas evaporated slightly at this stage. Then, during graphitization, a gas of a halogen or a compound thereof, for example, dichlorodifluoromethane was supplied from the start or at a stage where the graphitization proceeded slightly in a reduced pressure (about 0.1 Pa) as it was (flow rate was increased or decreased depending on the amount of the carbon material to be heated filled in the container, for example, at about 1 to 71 NTP/kg) for about 8 hours. During the step, an argon gas was always flown to the periphery of the heater with an aim of protecting the heater. By the procedures described above, the graphitization and high purification steps were completed. Successively, heat treatment applied for 5 hours while keeping the graphitized material was at 2200° C. and intensely reducing the pressure in the container to 0.1 Pa continuously (denitrogen step). In this case, an argon gas was flown also as a gas for the periphery of the heater to prevent intrusion of the nitrogen gas into the graphite material. Thus, a low nitrogen concentration carbonaceous material could be obtained. Then, after applying a heat treatment for a predetermined period of time, it was cooled to 200° C. while keeping the pressure in the container at 0.1 Pa. An argon gas was introduced as a rare gas into the container when it reached 200° C. and cooled to a room temperature. After cooling to the room temperature, the material was sealed together with the argon gas in a bag made of a resin film and stored so as not to be exposed to the atmospheric air.

Example 2

The graphite material after the graphitization and high purification steps by the same method as in Example 1, was taken out of the processing furnace. In this case, the material was sealed together with the argon gas in a gas made of a resin film and stored so as not to be exposed to atmospheric air. Then, the graphite material was taken out of the bag made of the resin film, mounted again in the furnace and re-heated at 220° C., and the pressure inside the container was intensely reduced to 0.1 Pa and a heat treatment was applied for 5 hours (denitrogen step). Then, after applying a heat treatment for a predetermined period of time, it was cooled to 200° C. while keeping the pressure in the container at 0.1 Pa. An argon gas was introduced as a rare gas into the container when it reached 200° C. and the material was cooled to the room temperature. After cooling to the room temperature, the material was sealed together with an argon gas in a bag made of a resin film for storing so as not to be exposed to the atmospheric air.

Example 3

A graphite material after the graphitization and high purification steps by the same method as in Example 1 was re-heated at 2200° C. and the pressure in the container was intensely reduced to 0.1 Pa and a heat treatment was applied for 5 hours (denitrogen step). After conducting the heat treatment for a predetermined or time, an argon gas was introduced as a rare gas into the container and cooled to a room temperature. After cooling to the room temperature, the material was sealed together with an argon gas in a bag made of a resin film and stored so as not to be exposed to the atmospheric air.

Example 4

The same procedures as those in Example 1 were conducted except for not intensely reducing the pressure in the container to 0.1 Pa and using an argon gas atmosphere at 2000° C. under the normal pressure as the denitrogen step.

Comparative Test 1

A graphite material completed with the graphitization and high purification treatment by the same method as in Example 1 was cooled by a nitrogen gas without conducting the denitrogen gas step and stored in atmospheric air, and the obtained material was defined as a specimen of Comparative Test 1.

Comparative Test 2

The same procedures as those in Example 1 were conducted except for not intensely reducing the pressure in the container to 0.1 Pa and using an argon gas atmosphere at 1800° C. under the normal pressure as the denitrogen step.

The nitrogen concentration contained in the specimens in the following stages (1) to (3) were measured respectively by GDMS.
(1) Nitrogen concentration in the graphite materials for Examples 1 to 4 and Comparative Tests 1 to 2.
(2) Nitrogen concentration in CVD-SiC formed on the surface of the graphite material for Examples 1 to 4 and Comparative Tests 1 to 2 as the substrates.
(3) Nitrogen concentration in epitaxial layers which were grown on the CVD-SiC deposited graphite susceptor of (2) and used.

The nitrogen concentration for each of the specimens is collectively shown in Table 1.

|  | Nitrogen concentration in graphite (ppm) | Nitrogen concentration in CVD-SiC (atoms/cm$^3$) | Nitrogen concentration in SiC epitaxial film (atoms/cm$^3$) |
| --- | --- | --- | --- |
| Example 1 | 8 | 2 × 10$^{15}$ | 4 × 10$^{13}$ |
| Example 2 | 10 | 3 × 10$^{15}$ | 3 × 10$^{13}$ |
| Example 3 | 15 | 1.2 × 10$^{18}$ | 8 × 10$^{13}$ |
| Example 4 | 98 | 4.5 × 10$^{18}$ | 5.1 × 10$^{14}$ |
| Comp. Test 1 | 850 | 4.5 × 10$^{18}$ | 5.0 × 10$^{16}$ |
| Comp. Test 2 | 380 | 1.2 × 10$^{17}$ | 1.0 × 10$^{16}$ |

From Table 1, it can be seen that the nitrogen concentration at each of the stages is low for the graphite materials after the denitrogen step. Accordingly, occurrence of crystal defects in SiC semiconductor devices can be suppressed correspondingly by using the low nitrogen concentration carbonaceous material according to Examples 1 to 4 as the jig for manufacturing SIC semiconductor.

Example 5

The graphite material after the graphitization step by the same method as Example 1 was taken out of the furnace. This graphite material was mounted in the furnace and treated by high purification step at the temperature of 2400° C. by dichlorodifluoromethane. Then, the same halogen containing gas was provided at the pressure of 5×10$^4$ Pa at 2200° C. and cooled to room temperature. The nitrogen concentration of specimen in the following stages (1) and (2) were measured by SIMS analysis.
(1) Nitrogen concentration in the graphite material for Example 5.
(2) Nitrogen concentration in CVD-SiC formed on the surface of graphite material for Example 5.

The nitrogen concentration for specimen of Example 5 is shown in Table 2.

TABLE 2

|  | Nitrogen concentration in graphite (atoms/cm$^3$) | Nitrogen concentration in CVD-SiC (atoms/cm$^3$) |
| --- | --- | --- |
| Example 5 | 0.8 × 10$^{17}$ | 2 × 10$^{15}$ |

Effect of the Invention

As described above, a low nitrogen concentration carbonaceous material can be formed by using a rare gas upon graphitization treatment or high purification treatment or by way of the denitrogen step after the high purification treatment, which can provide an effect of preventing intrusion of nitrogen to semiconductor devices can be suppressed even in a case of using the material as the jig for manufacturing compound semiconductors, and suppressing crystal defects in the semiconductor devices.

What is claimed is:

1. A low nitrogen content carbon comprising a graphite material, a carbon fiber-reinforced carbon composite material, exfoliated graphite sheet, a glassy carbon or a pyrolytic carbon, which has a nitrogen concentration according to glow discharge mass spectrometry of 100 ppm or less.

2. A method of manufacturing a low nitrogen content carbon, which comprises:
   heat treating a carbon material subjected to a high purification treatment in a halogen gas atmosphere, at a pressure of 100 Pa or less and at 1800° C. or higher;
   releasing nitrogen in the carbon material, and then cooling the material to a predetermined temperature at a pressure of 100 Pa or less; and then cooling the same to room temperature in a rare gas atmosphere.

3. A method of manufacturing a low nitrogen content carbon, which comprises:

heat treating a carbon material subjected to a high purification treatment in a halogen gas atmosphere, at a pressure of 100 Pa or less and at 1800° C. or higher;

releasing nitrogen in the carbon, and then introducing a rare gas; and then cooling the carbon to a room temperature in a rare gas atmosphere.

4. The method of manufacturing a low nitrogen content carbon as defined in claim 2, wherein the carbon is cooled to room temperature in the rare gas atmosphere and then stored in a state being kept from atmospheric air.

5. A low nitrogen content carbon obtained from a carbon by applying a high purification treatment in a halogen containing gas atmosphere at 2400° C. or higher to a carbon starting material and then further supplying a halogen containing gas under a reduced pressure at 2000° C. or higher, having a nitrogen concentration content of $1 \times 10^{17}$ atoms/$cm^3$ or less using SIMS analysis.

6. A method of manufacturing a low nitrogen content carbon, which comprises:

applying a high purification treatment to a carbon starting material in a halogen containing gas atmosphere at 2400° C. or higher; and then further supplying a halogen containing gas under a reduced pressure at 2000° C. or higher.

7. A The method of manufacturing a low nitrogen content carbon as defined in claim 3, wherein the carbon material is cooled to room temperature in the rare gas atmosphere and then stored in a state being kept from atmospheric air.

8. A low nitrogen content carbon having a nitrogen concentration content of $1 \times 10^{17}$ atoms/$cm^3$ or less as determined by SIMS analysis.

9. A low nitrogen content carbon having a nitrogen concentration as determined by glow discharge mass spectrometry of 100 ppm or less.

10. The carbon according to claim 9, wherein the nitrogen concentration is less than 50 ppm.

11. The carbon according to claim 10, wherein the nitrogen concentration is less than 10 ppm.

12. The method according to claim 2, wherein, after the heat treatment under a halogen gas atmosphere, the carbon material is heat treated at a temperature of higher than 2000° C. under a pressure of 1 Pa or less.

13. The method according to claim 3, wherein, after the heat treatment under a halogen gas atmosphere, the carbon material is heat treated at a temperature of higher than 2000° C. under a pressure of 1 Pa or less.

14. A jig for the manufacture of silicon semiconductors, compound semiconductors and/or for the manufacture of epitaxial layers, the jig shaped from being a carbon having a nitrogen content of $1 \times 10^{17}$ atoms/$cm^3$ or less as determined by SIMS analysis.

* * * * *

UNITED STATES PATENT AND TRADEMARK OFFICE
CERTIFICATE OF CORRECTION

PATENT NO. : 6,881,680 B2
DATED : April 19, 2005
INVENTOR(S) : Ichiro Fujita

It is certified that error appears in the above-identified patent and that said Letters Patent is hereby corrected as shown below:

Column 6,
Line 67, "220° C", should read -- 2200° C --.

Column 7,
Line 19, "predetermined or time" should read -- predetermined time --.

Column 10,
Line 1, "A The" should read -- The --;
Lines 11 and 13, "The carbon" should read -- The low nitrogen content carbon --;
Line 20, "carbon" should read -- carbonaceous -- and
Line 25, "from being a" should read -- from a --.

Signed and Sealed this

Ninth Day of August, 2005

JON W. DUDAS
*Director of the United States Patent and Trademark Office*